(12) United States Patent
Nishikawa et al.

(10) Patent No.: US 8,703,626 B2
(45) Date of Patent: Apr. 22, 2014

(54) METHOD, TOOL, AND APPARATUS FOR MANUFACTURING A SEMICONDUCTOR DEVICE

(75) Inventors: Koichi Nishikawa, Nagoya (JP);
Masaaki Shimizu, Iruma (JP); Kenichi Nonaka, Tokyo (JP); Seiichi Yokoyama, Tokorozawa (JP); Hideki Hashimoto, Kawagoe (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 551 days.

(21) Appl. No.: 11/889,403

(22) Filed: Aug. 13, 2007

(65) Prior Publication Data

US 2008/0052901 A1    Mar. 6, 2008

(30) Foreign Application Priority Data

Aug. 31, 2006   (JP) .................... 2006-236606

(51) Int. Cl.
*H01L 21/00*          (2006.01)

(52) U.S. Cl.
USPC ........................................................ 438/799

(58) Field of Classification Search
USPC .......... 118/715, 500, 503; 438/199, 800, 795, 438/799, 798, FOR. 407, FOR. 408; 29/825, 29/829; 219/521, 526; 257/718, 798
See application file for complete search history.

(56) References Cited

U.S. PATENT DOCUMENTS

| | | | |
|---|---|---|---|
| 5,228,501 A | | 7/1993 | Tepman et al. |
| 5,405,518 A | | 4/1995 | Hsieh et al. |
| 5,437,757 A | | 8/1995 | Rice et al. |
| 5,966,623 A | * | 10/1999 | Khosla et al. ............... 438/471 |
| 6,146,926 A | * | 11/2000 | Bhatnagar et al. .......... 438/140 |
| 6,187,134 B1 | | 2/2001 | Chow et al. |
| 6,593,168 B1 | * | 7/2003 | Ehrichs et al. .............. 438/108 |
| 2001/0037862 A1 | | 11/2001 | Moriuchi |
| 2003/0162314 A1 | * | 8/2003 | Yamazaki et al. ............ 438/46 |
| 2004/0060513 A1 | | 4/2004 | Kojima et al. |
| 2004/0255848 A1 | * | 12/2004 | Yudasaka ..................... 118/50 |
| 2005/0011441 A1 | * | 1/2005 | Kannan ....................... 118/715 |
| 2007/0167026 A1 | | 7/2007 | Miura |

FOREIGN PATENT DOCUMENTS

| | | |
|---|---|---|
| EP | 0 601 615 A1 | 6/1994 |
| JP | 60-239400 A | 11/1985 |
| JP | 2-228035 A | 9/1990 |
| JP | 03-064040 A | 3/1991 |

(Continued)

*Primary Examiner* — Colleen Matthews
*Assistant Examiner* — Quovaunda V Jefferson
(74) *Attorney, Agent, or Firm* — Birch, Stewart, Kolasch & Birch, LLP

(57) ABSTRACT

A method of manufacturing a semiconductor device, includes increasing adherence between a susceptor as a heating element, and a semiconductor substrate disposed on the susceptor, by using an adherence increasing mechanism, or increasing heat transmitted to a semiconductor substrate, which is disposed on a susceptor as a heating element, by using a transmitted-heat increasing mechanism; and heating the semiconductor substrate to have a predetermined temperature by heating the susceptor. The adherence increasing mechanism may include the susceptor and one of a heavy-weight stone disposed on the semiconductor substrate, a cap disposed on the semiconductor substrate and engaged with the susceptor, and an adhesive layer provided between the susceptor and the semiconductor substrate. The transmitted-heat increasing mechanism may include the susceptor and small pieces which are disposed on the semiconductor substrate and have radiated-light absorption ability. The susceptor may hold a plurality of the semiconductor substrates in a stacked form.

24 Claims, 15 Drawing Sheets

(56) References Cited

FOREIGN PATENT DOCUMENTS

| | | |
|---|---|---|
| JP | 5-29140 U | 4/1993 |
| JP | 5-166730 A | 7/1993 |
| JP | 06-053308 A | 2/1994 |
| JP | 11-330214 A | 11/1999 |
| JP | 2003-152059 A | 5/2003 |
| JP | 200-197464 * | 7/2005 |
| JP | 2005-197464 A | 7/2005 |
| JP | 2006-013269 A | 1/2006 |
| WO | WO-95/23427 A2 | 8/1995 |

* cited by examiner

METHOD, TOOL, AND APPARATUS FOR MANUFACTURING A SEMICONDUCTOR DEVICE

BACKGROUND OF THE INVENTION

1. Field of the Invention

The present invention relates to a method for manufacturing a semiconductor device, which includes a step of heating a semiconductor substrate in a vacuum. The present invention also relates to a tool for manufacturing a semiconductor device, which is used in the above step, and a relevant apparatus for manufacturing a semiconductor device.

Priority is claimed on Japanese Patent Application No. 2006-236606, filed Aug. 31, 2006, the content of which is incorporated herein by reference.

2. Description of the Related Art

In comparison with silicon (Si), wide band gap (WBG) semiconductors such as silicon carbide (SiC) or gallium nitride (GaN) have a wider band gap, and thus are materials having superior voltage-resistant and heat-resistant characteristics. Therefore, they are anticipated as potential materials for power devices. The structures of WBG power devices, which are being actively researched and developed at present, are mainly classified into a Schottky barrier diode (SBD), a PiN junction diode (PiND), a MOS (metal oxide semiconductor) transistor, and a junction transistor. Among them, the structures of the SBD and the junction transistor will be explained.

FIG. 17 is a schematic plan view showing a planar structure of an SBD. FIG. 18 is a schematic sectional view showing a sectional structure of the SBD along line A-A in FIG. 17. A drift layer 110, which is an n-type high-resistance layer, is formed on one face of a cathode layer 100, which is an n-type low-resistance layer. A Schottky electrode 120 is formed on the surface of the drift layer 110. A junction electrode 130 is formed on the surface of the Schottky electrode 120. In a part of the surface of the drift layer 110, a guard ring area 140, which is a p-type low-resistance layer, is formed so as to surround the Schottky electrode 120. An insulating layer 150 is formed in a manner such that it hangs over the guard ring area 140, the Schottky electrode 120, and the junction electrode 130. An Ohmic electrode 160 and a junction electrode 170 are formed on the other face of the cathode layer 100.

FIG. 19 is a schematic plan view showing a planar structure of a junction transistor. FIG. 20 is a schematic sectional view showing a sectional structure of the junction transistor along line B-B in FIG. 19. A drift layer 210, which is an n-type high-resistance layer, is formed on one face of a drain layer 200, which is an n-type low-resistance layer. A source area 220, which is an n-type low-resistance area, is formed in a part of the surface of the drift layer 210. A gate area 230, which is a p-type low-resistance area and surrounds the source area 220, is formed in a part of the surface of the drift layer 210. A source electrode 240 is formed on the source area 220, and a gate electrode 250 is formed on the gate area 230. A drain electrode 260 is formed on the other face of the drain layer 200.

As shown in FIG. 19, a number of the source electrodes 240 are arranged, which are isolated from each other. Each of the source electrodes 240 has an elongated form. Around each source electrode 240, the gate electrode 250 is provided as a control electrode. The on/off state of electric current flowing between the source electrode 240 and the gate electrode 260 is controlled using a signal applied to the gate electrode 250.

Generally, due to a difference in material for the substrate, known processes for manufacturing silicon devices cannot be directly applied to the processes for manufacturing the above-described WBG devices. Therefore, development of a novel processing technique is of great importance. A technique for forming a selective conductive area, such as the guard ring area 140 in FIG. 18, or the gate area 230 in FIG. 20, is an example of such a technique. WBG materials have a relatively small diffusion coefficient with respect to impurities, which are used for controlling the conductivity of the semiconductor. Therefore, when forming the guard ring area or the gate area as a selective conductive area, a thermal diffusion method used in the processes for silicon devices cannot be used. Accordingly, an ion implantation method is mainly used for controlling the conductive type.

In the first step of the ion implantation method, an element suitable for the relevant conductive type is ionized in a vacuum, and generated ions are accelerated through an electric field so as to have a desired velocity. The accelerated ions are injected into a WBG material. For example, with respect to silicon carbide, nitrogen (N) or phosphorus (P) may be an element suitable for the n-type, and aluminium (Al) or boron (B) may be an element suitable for the p-type. After only the ions are injected, (i) WBG crystals have defects due to the ion injection, and (ii) sufficient engagement between the injected element and the semiconductor crystals has not yet been established. Therefore, thermal processing at a high temperature is performed so as to repair and remove the defects in crystals, and to incorporate the injected element into the crystals. Such thermal processing is called "activation (or activation annealing)".

During the activation, for example, a WBG substrate is disposed on a susceptor made of graphite, which is set in a quartz chamber, the periphery of the susceptor is covered with a heat insulating material, and the WBG substrate is heated by induction heating (from the outside of the quartz chamber) while using the graphite as a thermal source, so that the substrate reaches a desired temperature. Generally, the heating is performed in a rare gas such as argon, as an atmospheric gas. However, impurities included in the rare gas contaminate or corrode the surface of the WBG substrate, so that the surface of the WBG substrate becomes rough. Such roughness of the surface degrades the performance or characteristics of the semiconductor device. Therefore, it is desirable to reduce the surface roughness as much as possible.

Reduction of the surface roughness can be anticipated by using a vacuum atmosphere for the activation, instead of the rare gas. Generally, the highest purity with respect to presently-available gases is 99.9999%, and impurities of approximately 1 ppm are included therein. The partial pressure of impurities in a rare gas at the atmospheric pressure is $1\times10^{-1}$ Pa. However, when using a vacuum apparatus in the current technique, $1\times10^{-4}$ Pa or less (for impurities) can be reliably obtained with respect to the total gas pressure including rare gas pressures. Generally, a combination of a turbo molecular pump or a diffusion pump, and an oil-sealed rotary pump or a dry pump is generally used as such a vacuum apparatus. Accordingly, it is possible to make the amount of impurities, which cause damage on the surface of the WBG substrate, be $1/1000$ or less in comparison with the case of not using a vacuum apparatus.

However, heating in a vacuum has a problem. Generally, there are three mechanism for heat transmission, such as radiation, convection, and transmission. In the radiation mechanism, light radiated from a higher-temperature object should be absorbed by a lower-temperature object. Here, WBG materials, having a wide band gap, cannot absorb such light generated by radiation, and thus are not heated. That is, radiated light passes through the WBG substrate without providing heat to the substrate, and thus it is very difficult to heat the WBG substrate.

FIG. 21 is a graph showing wavelength dependency of the light absorption rate of 4H—SiC (as an example of WBG materials), and also wavelength dependency of light intensity radiated from a heating source. Silicon carbide having a band gap of 3.2 eV can absorb light having a wavelength of 380 nm or shorter, however, it transmits light having a longer wavelength. On the other hand, light radiated from any heating source has a wavelength of 400 nm or higher even at 2000° C., so that it cannot heat silicon carbide.

When heating is performed in a rare-gas atmosphere, the convection and transmission mechanisms can be used. In the convention mechanism, the relevant susceptor heats a rare gas, which exists in a gap between the susceptor and the WBG substrate, and the heated gas heats the WBG substrate. In the transmission mechanism, heat is directly transmitted from the graphite susceptor to the WBG substrate. The amount of heat, which is directly transmitted from the graphite susceptor to the WBG substrate, considerably depends on the contact area between the susceptor and the WBG substrate. Although a face of the graphite susceptor contacts a face of the WBG substrate, a slight warp or unevenness is present in either face, actually. Therefore, both faces do not sufficiently contact each other only by disposing the WBG substrate on the susceptor. Accordingly, the convention mechanism mainly controls the heating in a rare-gas atmosphere. FIG. 22 is a schematic diagram showing a state in which a WBG substrate 1 is simply disposed on a susceptor 2e in conventional techniques.

On the other hand, when considering heating in a vacuum, heating cannot be executed using radiation as described above, or also by convection because there is no gas as a medium for transmitting heat. Therefore, the WBG substrate is heated only by the transmission mechanism. However, the contact area between the WBG substrate and the susceptor, either of which has a slight warp, is not constant due to an individual difference or a disposing manner of the substrate. Therefore, reproducible heat-transmitting performance cannot be obtained, and thus desired device performance or characteristics cannot be obtained. In order to solve this problem, Patent Document 1 discloses a method of depositing carbon or metal on the back face of a semiconductor substrate.

Patent Document 1: Japanese Utility Model Application, First Publication No. H5-29140.

As described above, conventional techniques have a problem such that it is difficult to heat a semiconductor substrate in a vacuum. In addition, the method disclosed in Patent Document 1 has a problem such that it is difficult to remove a deposited film after thermal processing, and also a problem such that the semiconductor substrate or a manufacturing line is contaminated by metal.

SUMMARY OF THE INVENTION

In light of the above circumstances, an object of the present invention is to provide a method, a tool, and an apparatus for manufacturing a semiconductor device, by which a semiconductor substrate can be easily heated in a vacuum without metal contaminating the semiconductor substrate or a relevant manufacturing line. Some problems to be solved by the present invention have been explained in detail above so as to clearly show the significance of some effects obtained by the present invention, however, the above explanation should not limit the technical range of the present invention.

Therefore, the present invention provides a method of manufacturing a semiconductor device, comprising the steps of:

increasing adherence between a susceptor as a heating element, and a semiconductor substrate disposed on the susceptor, by using an adherence increasing mechanism; and heating the semiconductor substrate to have a predetermined temperature by heating the susceptor.

In a typical example, the adherence increasing mechanism includes the susceptor and a heavy-weight stone disposed on the semiconductor substrate, wherein the heavy-weight stone has a weight by which the susceptor and the semiconductor substrate closely adhere to each other.

Preferably, the heavy-weight stone is disposed outside an area for forming a device in the semiconductor substrate.

Also preferably, the heavy-weight stone is a heating element.

In another typical example, the adherence increasing mechanism includes the susceptor and a cap which is disposed on the semiconductor substrate, and engaged with the susceptor.

Preferably, the cap is disposed outside an area for forming a device in the semiconductor substrate.

Also preferably, the cap is a heating element.

In another typical example, the adherence increasing mechanism includes the susceptor and an adhesive layer which is provided between the susceptor and the semiconductor substrate.

Preferably, the main constituent of the adhesive layer is saccharide.

The present invention also provides a method of manufacturing a semiconductor device, comprising the steps of:

increasing heat transmitted to a semiconductor substrate, which is disposed on a susceptor as a heating element, by using a transmitted-heat increasing mechanism; and heating the semiconductor substrate to have a predetermined temperature by heating the susceptor.

In a typical example, the transmitted-heat increasing mechanism includes the susceptor and a plurality of small pieces which are disposed on the semiconductor substrate and have radiated-light absorption ability.

Preferably, the susceptor can hold a plurality of the semiconductor substrates in a stacked form. In this case, the small pieces may be arranged in a manner such that they do not overlap with each other in plan view.

Also preferably, the small pieces are disposed outside an area for forming a device in the semiconductor substrate.

In either method, typically, the step of heating the semiconductor substrate is performed in a vacuum.

Also in either method, typically, the main constituent of the semiconductor substrate is one of silicon carbide and diamond.

Also in either method, typically, the main constituent of the semiconductor substrate is nitride. In this case, the nitride may be one of gallium nitride, aluminum nitride, boron nitride, aluminum gallium nitride, and boron aluminum gallium nitride.

Also in either method, typically, the semiconductor device is one of a Schottky barrier diode, a PiN junction diode, an MPS diode, a JBS diode, a MOS FET, a static induction transistor, a junction field effect transistor, a MES FET, and a bipolar transistor.

The present invention also provides a tool for manufacturing a semiconductor device, wherein:

the tool is used for holding a semiconductor substrate when heating the semiconductor substrate to have a predetermined temperature by means of heat from a susceptor as a heating element; and the tool has an adherence increasing mechanism for increasing adherence between the semiconductor substrate and the susceptor.

Also in either method, typically, the adherence increasing mechanism includes the susceptor on which the semiconductor substrate is disposed, and a heavy-weight stone disposed on the semiconductor substrate, wherein the heavy-weight stone has a weight by which the susceptor and the semiconductor substrate closely adhere to each other.

Preferably, in the adherence increasing mechanism, when the semiconductor substrate is held, the heavy-weight stone is disposed outside an area for forming a device in the semiconductor substrate.

Also preferably, the heavy-weight stone is a heating element.

In another typical example, the adherence increasing mechanism includes the susceptor and a cap which is disposed on the semiconductor substrate, and engaged with the susceptor.

Preferably, in the adherence increasing mechanism, when the semiconductor substrate is held, the cap is disposed outside an area for forming a device in the semiconductor substrate.

Also preferably, the cap is a heating element.

In another typical example, the adherence increasing mechanism includes the susceptor and an adhesive layer which is provided between the susceptor and the semiconductor substrate.

Preferably, the main constituent of the adhesive layer is saccharide.

The present invention also provides a tool for manufacturing a semiconductor device, wherein:

the tool is used for holding a semiconductor substrate when heating the semiconductor substrate to have a predetermined temperature by means of heat from a susceptor as a heating element; and the tool has a transmitted-heat increasing mechanism for increasing heat transmitted to the semiconductor substrate.

In a typical example, the transmitted-heat increasing mechanism includes the susceptor and a plurality of small pieces which are disposed on the semiconductor substrate and have radiated-light absorption ability.

Preferably, the susceptor can hold a plurality of the semiconductor substrates in a stacked form. In this case, the small pieces may be arranged in a manner such that they do not overlap with each other in plan view.

Also preferably, in the transmitted-heat increasing mechanism, when the semiconductor substrate is held, the small pieces are disposed outside an area for forming a device in the semiconductor substrate.

The present invention also provides an apparatus for manufacturing a semiconductor device, comprising:

a tool as described above;

a vacuum chamber for containing the semiconductor substrate and the tool; and a heating mechanism for heating the susceptor.

In accordance with the present invention, the contact area between the semiconductor substrate and the heating element increases, so that heat can be easily transmitted from the heating element to the semiconductor substrate. Therefore, it is possible to easily heat the semiconductor substrate in a vacuum. In addition, each of the heavy-weight stone, the cap, the small pieces, and the adhesive layer can be easily removed, so that it is possible to prevent the semiconductor substrate or a relevant manufacturing line from being contaminated by metal.

DETAILED DESCRIPTION OF THE INVENTION

Hereinafter, embodiments in accordance with the present invention will be described with reference to the appended figures.

Below, a first embodiment will be explained, in which a semiconductor substrate is heated in a state shown by FIGS. 1 to 3.

Figure 1:
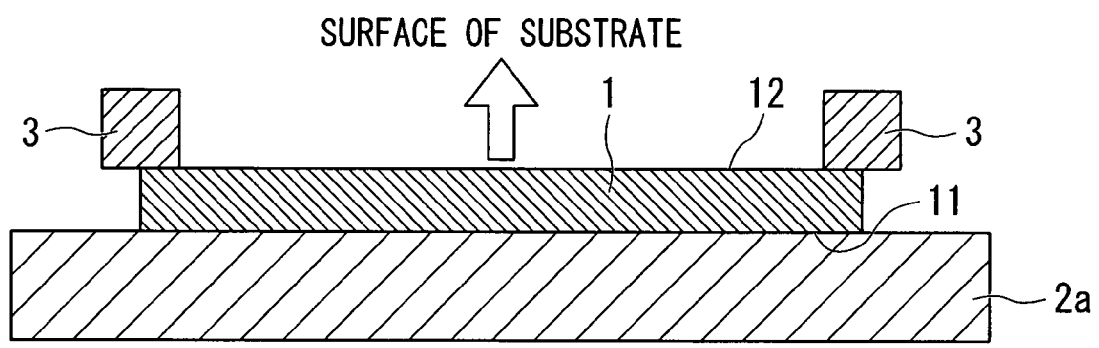
FIG. 1 is a schematic sectional view showing a tool and a semiconductor substrate in a first embodiment in accordance with the present invention.

FIG. 1 is a sectional view showing a tool and a WBG substrate (as the semiconductor substrate) in the first embodiment. FIG. 2 is a plan view showing the tool and the WBG substrate in the first embodiment. FIG. 3 is a perspective view showing the tool and the WBG substrate in the first embodiment.

The WBG substrate 1 is disposed on a susceptor 2a (whose main constituent may be graphite (C)) in a manner such that a main surface 11 of the WBG substrate 1 faces the susceptor 2a. On another main surface 12 of the WBG substrate 1, a heavy-weight stone 3 is disposed. The above susceptor 2a and the heavy-weight stone 3 function as a tool for manufacturing a semiconductor device, in accordance with the present invention.

Due to the gravity applied to the heavy-weight stone 3, the WBG substrate 1 is pushed onto the susceptor 2a, which is a heating element (or a heating body). Accordingly, the adherence between the WBG substrate 1 and the susceptor 2a is improved, and their relevant surfaces adhere to each other entirely. Therefore, the contact area between the WBG substrate 1 and the susceptor 2a increases, and heat transmission from the susceptor 2a to the WBG substrate 1 is sufficiently performed. Here, the susceptor 2a and the heavy-weight stone 3 correspond to the adherence increasing mechanism of the present invention.

When the main surface 12 of the WBG substrate 1 is a surface on which a target device is formed, if the WBG substrate 1 and the heavy-weight stone 3 contact in an area (i.e., a device forming area) where the device is formed, the relevant surface of the WBG substrate 1 is damaged, thereby degrading device characteristics. Therefore, it is preferable to push only the peripheral edge of the WBG substrate 1 by the heavy-weight stone 3. Here, heat is conducted quickly inside the WBG substrate 1 (e.g., silicon carbide has a heat conductivity three times as much as that of silicon). Therefore, when heat is conducted to the outer periphery of the WBG substrate 1, the heat can be sufficiently conducted to the center thereof, with a superior repeatability.

Figure 2:
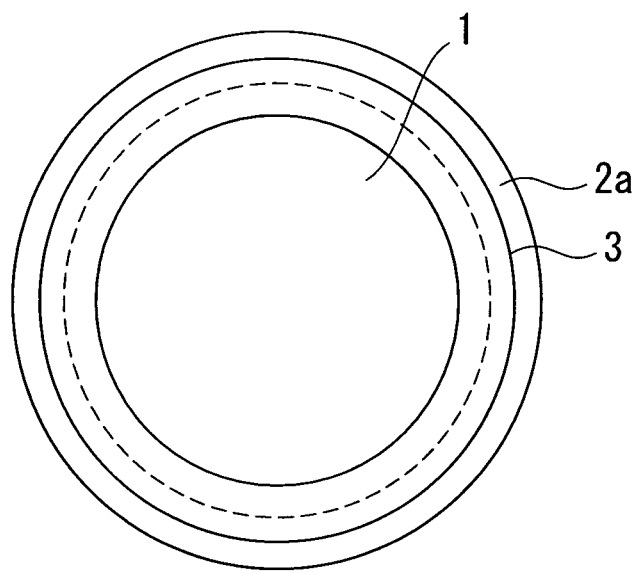
FIG. 2 is a schematic plan view showing the tool and the WBG substrate in the first embodiment.
Figure 3:
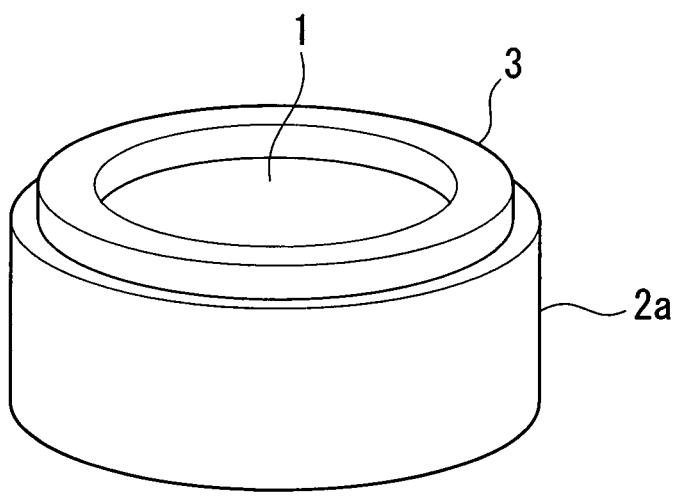
FIG. 3 is a schematic perspective view showing the tool and the WBG substrate in the first embodiment.

The form of the heavy-weight stone 3 is not limited, however, in FIG. 2, it is a ring shape in plan view. The ring shape may be a circular or a polygonal ring form. When the heavy-weight stone 3 has a plate shape instead of the ring shape, it preferably has thicker peripheral edges in comparison with the remaining part which faces a device forming area in the main surface 12 of the WBG substrate 1, so that contact between the WBG substrate 1 and the heavy-weight stone 3 is prohibited in the device forming area.

The material of the heavy-weight stone 3 is not limited. However, in order that the heavy-weight stone 3 itself functions as a heating element so as to transmit heat to the WBG substrate 1 and improve heating efficiency, it is preferable that the heavy-weight stone 3 be made of a material having a superior heating performance by means of induction heating or radiated-light absorption. The heavy-weight stone 3 has a weight by which the WBG substrate 1 and the susceptor 2a closely adhere to each other, and thus may be made of metal having a high melting point, such as graphite, tungsten (W), molybdenum (Mo), or tantalum (Ta), or a carbide of any one of them. The heavy-weight stone 3 may also be (i) a mixture of separate elements, which are graphite and a metal having a high melting point, or a carbide thereof, or (ii) graphite, at least a part of which is covered with a metal having a high melting point, or a carbide thereof. Preferably, when the WBG substrate 1 is heated (e.g., at approximately 2000° C.), the heavy-weight stone 3 is not deformed or does not undergo a chemical change, and also preferably, it does not damage the WBG substrate 1.

Figure 4:
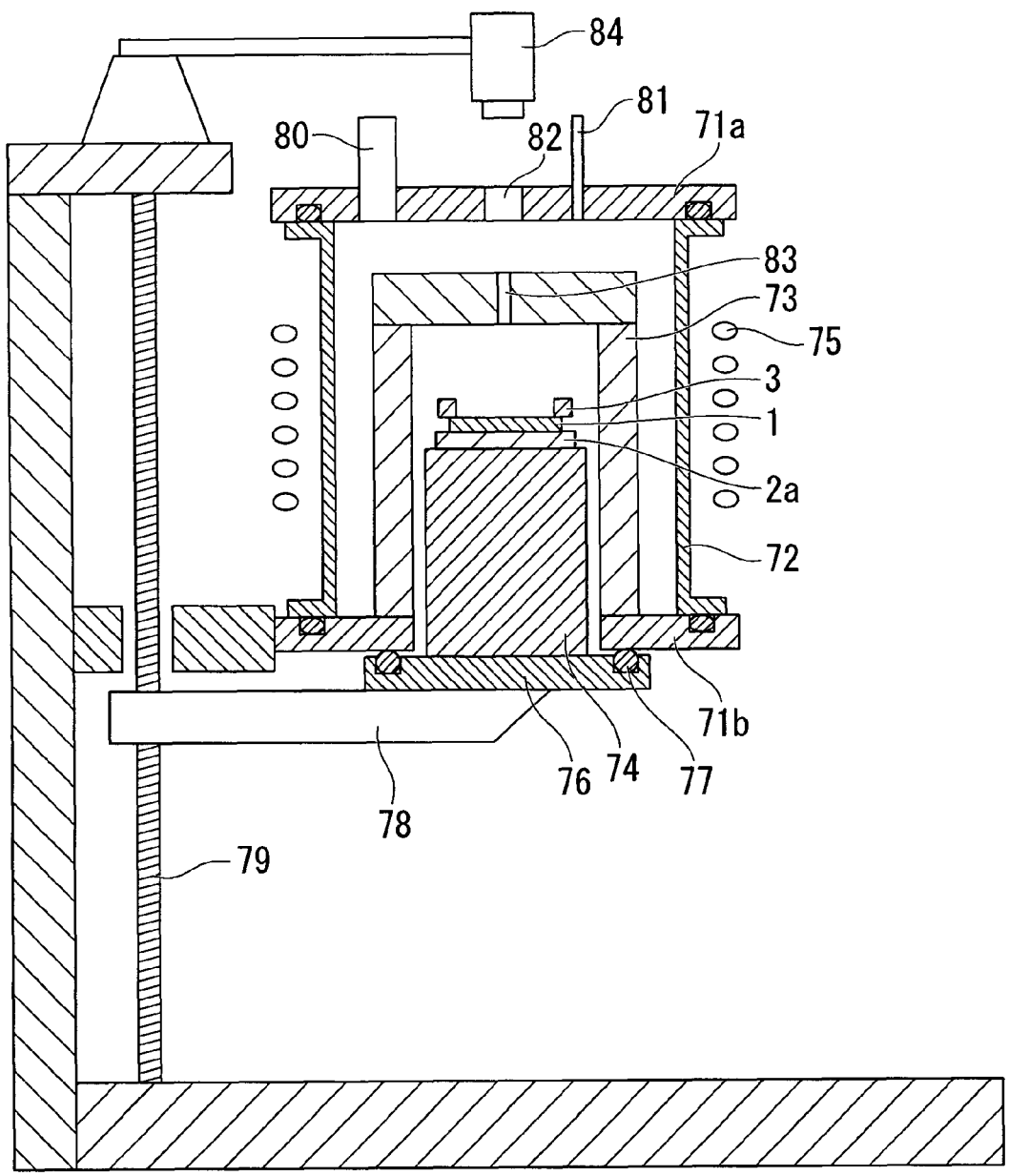
FIG. 4 is a schematic sectional view of a heating apparatus, which is used for heating the semiconductor substrate in the first embodiment.

FIG. 4 is a schematic sectional view of a heating apparatus, which is used during activation. The susceptor 2a, against which the WBG substrate 1 is pushed by the heavy-weight stone 3, is contained and disposed in a quartz chamber 72 (i.e., a vacuum chamber), the top and bottom of which are respectively sealed using metal flanges 71a and 71b. The susceptor 2a is surrounded by a heat insulating material 73, and a support member 74 for supporting the susceptor 2a from the bottom side thereof is also made of a heat insulating material. A coil 75 for induction heating (i.e., a heating mechanism) is provided around the quartz chamber 72. The WBG substrate 1 is heated to have a desired temperature by induction heating using the susceptor 2a as a heating source.

The support member 74 is disposed on a hatch 76, which is used for sample exchange. When the WBG substrate 1 is heated, the hatch 76 is fastened to the flange 71b via an O-ring 77, and when the substrate is exchanged, a support part 78 for supporting the hatch 76 descends together with the hatch 76 by a lifting mechanism 79. An exhaust port 80 and a gas drawing port 81 are provided at the flange 71a so as to control the atmosphere during heating, and they are respectively connected to a vacuum pump and a gas source (both not shown). Additionally, in order to control the temperature of the substrate during the heating, observation windows 82 and 83 are respectively formed in the flange 71a and the heat insulating material 73. The temperature is measured using a radiation thermometer 84, which is arranged above the flange 71a. The observation window 82 is closed by a quartz or sapphire glass. The heating apparatus having the above-described basic structure can be similarly used in other embodiments (employing different tool structures) which will be explained later.

Below, the procedure of the heating process in the first embodiment will be explained with reference to FIG. 5, which is a flowchart showing the procedure. Here, the present invention can be applied, not only to a heating process executed after ion implantation, but also to another heating process. In addition, the present invention can produce efficient heating effects, not only by a process executed in a vacuum, but also by a process executed in a rare gas.

First, the WBG substrate 1 is disposed on the susceptor 2a in the quartz chamber 72 of the heating apparatus in the atmospheric pressure (see step S100), and the heavy-weight stone 3 is further disposed thereon (see step S110). In the next step, the quartz chamber 72 is exhausted using the vacuum pump (see step S120), so as to provide a vacuum state, in which the pressure in the quartz chamber 72 may be approximately $1 \times 10^{-10}$ to $1 \times 10^{-3}$ Pa.

In the next step, a rare gas such as argon is supplied into the quartz chamber 72 (see step S130). When heating is performed in a vacuum, the process of step S130 is omitted. Next, the WBG substrate 1 is heated to reach a desired temperature (e.g., approximately 2000° C.) by induction heating (see step S140), and then it is cooled by leaving the substrate in a cool atmosphere, or moving the substrate to a cooling stage (see step S150). The quartz chamber 72 is then returned to the atmospheric atmosphere (see step S160), and the heavy-weight stone 3 and the WBG substrate 1 are collected (i.e., removed) (see steps S170 and S180).

In accordance with the above-described embodiment, the WBG substrate 1 is pushed against the susceptor 2a by means of the heavy-weight stone 3, so that the contact area between the WBG substrate 1 and the susceptor 2a increases. Therefore, heat is easily transmitted from the susceptor 2a to the WBG substrate 1, thereby easily heating the WBG substrate 1 in the vacuum. With respect to contamination of the WBG substrate 1 due to the heavy-weight stone 3, the heavy-weight stone 3 is simply disposed on the WBG substrate 1, so that it can be more easily separated from the substrate in comparison with the conventional carbon or metal deposition method, which is disclosed in Patent Document 1, or the like. Therefore, it is possible to prevent the semiconductor substrate or the relevant manufacturing line from being contaminated by metal. Furthermore, it is unnecessary to use a complex mechanism for raising or lowering the heavy-weight stone 3 so as to switch the state of the WBG substrate 1 and the heavy-weight stone 3 between contact and non-contact states, and thus heating of the WBG substrate 1 can be performed using a simple structure.

Figure 6:
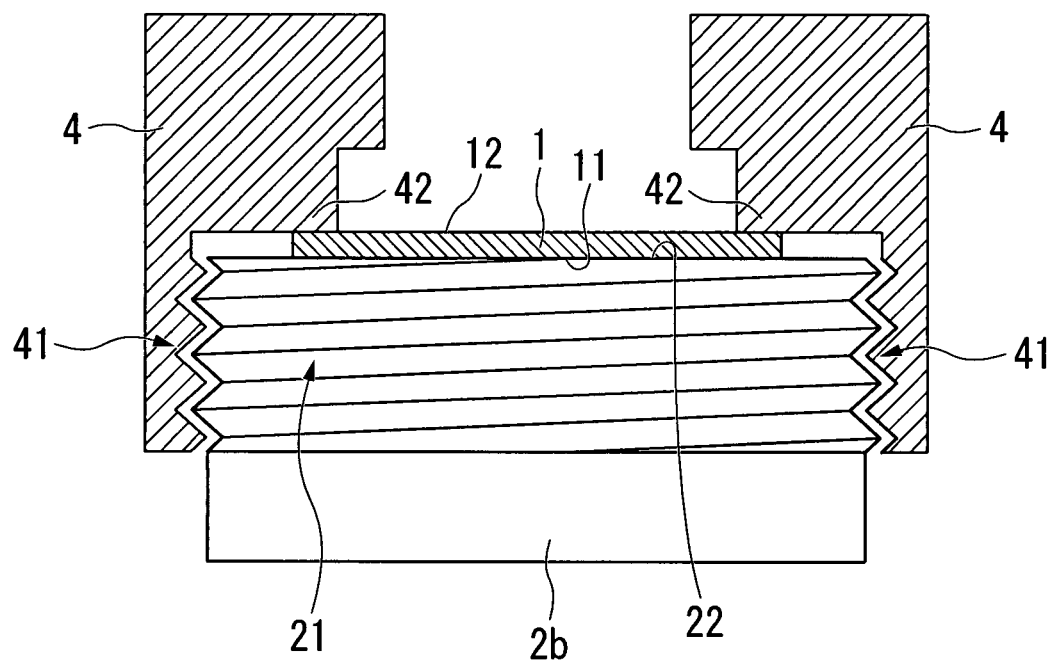
FIG. 6 is a schematic sectional view showing a tool and a semiconductor substrate in a second embodiment in accordance with the present invention.
Figure 7:
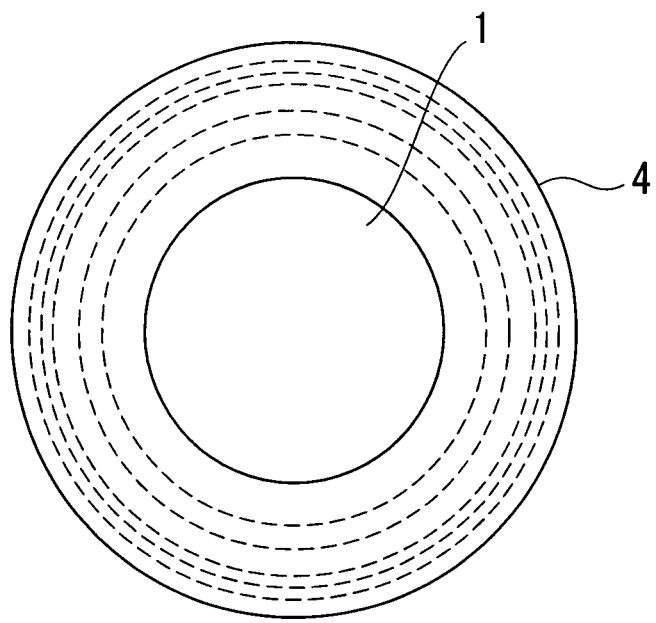
FIG. 7 is a schematic plan view showing the tool and the WBG substrate in the second embodiment.
Figure 8:
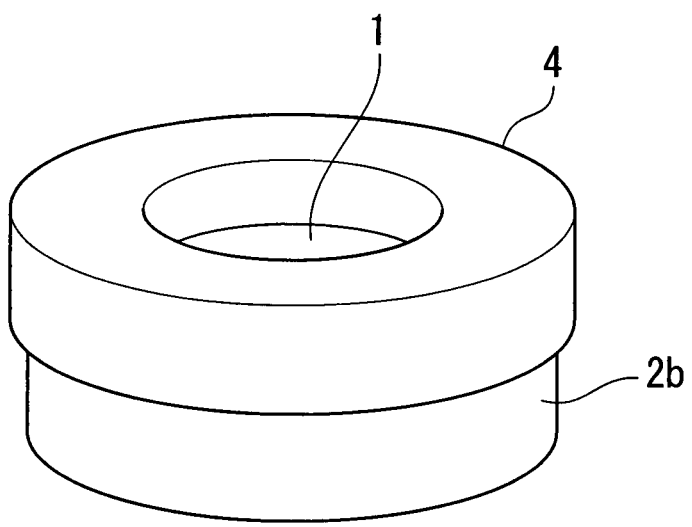
FIG. 8 is a schematic perspective view showing the tool and the WBG substrate in the second embodiment.

Next, a second embodiment of the present invention will be explained. In the present embodiment, heating of a semiconductor substrate is performed in a state shown by FIGS. 6 to 8. FIG. 6 is a sectional view showing a tool and a WBG substrate (as the semiconductor substrate) in the second embodiment. FIG. 7 is a plan view showing the tool and the WBG substrate in the second embodiment. FIG. 8 is a perspective view showing the tool and the WBG substrate in the second embodiment.

The WBG substrate 1 is disposed on a susceptor 2b in a manner such that a main surface 11 of the WBG substrate 1 faces a contact part 22 of the susceptor 2b. A cap 4 (as a screw member) contacts the other main surface 12 of the WBG substrate 1. The cap 4 has a female screw part 41, with which a male screw part 21, formed at the susceptor 2b, is engaged. The susceptor 2b and the cap 4 function as a tool for manufacturing a semiconductor device, in accordance with the present invention.

While the cap 4 is detached from the susceptor 2b, or a sufficient space is provided between the cap 4 and the susceptor 2b, the WBG substrate 1 is disposed on the susceptor 2b, and then the cap 4 is engaged with the susceptor 2b. Accordingly, the contact part 42 of the cap 4 contacts the main surface of the WBG substrate 1, and the WBG substrate 1 is pushed against the contact part 22 of the susceptor 2b, which is a heating element. That is, the adherence between the WBG substrate 1 and the susceptor 2b is improved, and their relevant surfaces adhere to each other entirely. Therefore, the contact area between the WBG substrate 1 and the susceptor 2b increases, and heat transmission from the susceptor 2b to the WBG substrate 1 is sufficiently performed. Here, the susceptor 2b and the cap 4 correspond to the adherence increasing mechanism of the present invention.

When the main surface of the WBG substrate 1 is a surface on which a target device is formed, if the WBG substrate 1 and the cap 4 contact in an area where the device is formed, the relevant surface of the WBG substrate 1 is damaged, thereby degrading device characteristics. Therefore, it is preferable that the contact part 42 of the cap 4 contact only the peripheral edge of the WBG substrate 1.

The material of the cap 4 is not limited. However, in order that the cap 4 itself functions as a heating element so as to transmit heat to the WBG substrate 1 and improve heating efficiency, it is preferable that the cap 4 be made of a material having a superior heating performance by means of induction heating or radiated-light absorption.

The cap 4 may also be made of metal having a high melting point, such as graphite, tungsten, molybdenum, or tantalum, or a carbide of any one of them. In addition, the cap 4 may also be (i) a mixture of separate elements, which are graphite and a metal having a high melting point, or a carbide thereof, or (ii) graphite, at least a part of which is covered with a metal having a high melting point, or a carbide thereof. Preferably, when the WBG substrate 1 is heated (e.g., at approximately 2000° C.), the cap 4 does not become deformed or undergo a chemical change, and also preferably, it does not damage the WBG substrate 1.

Figure 5:
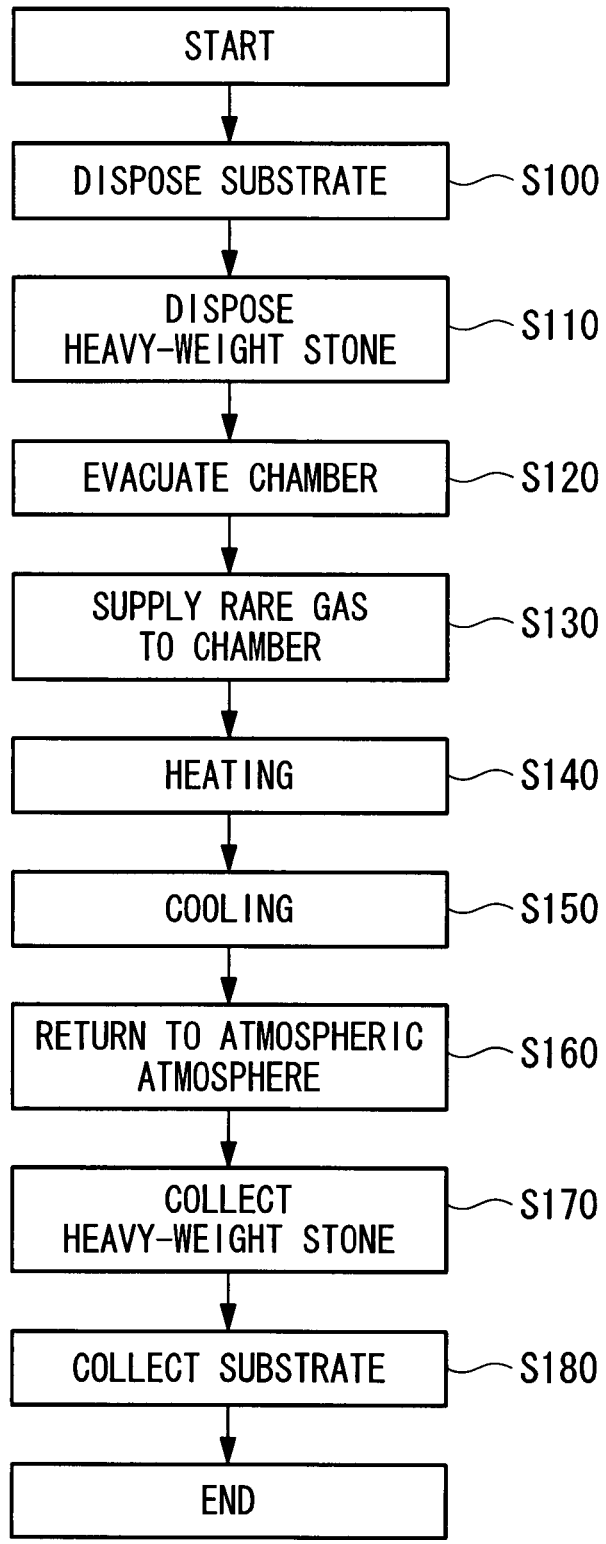
FIG. 5 is a flowchart showing the procedure of the heating process in the first embodiment.

The heating process in the present embodiment can be performed using the heating apparatus shown in FIG. 4, and the procedure thereof is similar to that shown in FIG. 5.

In accordance with the above-described embodiment, when the cap 4 is engaged with the susceptor 2b, the WBG substrate 1 is pushed against the contact part 22 of the susceptor 2b by means of the contact part 42 of the cap 4, so that the contact area between the WBG substrate 1 and the susceptor 2b increases. Therefore, heat is easily transmitted from the susceptor 2b to the WBG substrate 1, thereby easily heating the WBG substrate 1 in the vacuum. With respect to contamination of the WBG substrate 1 due to the cap 4, the cap 4 is simply engaged with the susceptor 2b, so that it can be more easily separated from the substrate in comparison with the conventional carbon or metal deposition method, which is disclosed in Patent Document 1, or the like. Therefore, it is possible to prevent the semiconductor substrate or the relevant manufacturing line from being contaminated by metal. Furthermore, it is unnecessary to use a complex mechanism for switching the state of the WBG substrate 1 and the cap 4 between contact and non-contact states, and thus heating of the WBG substrate 1 can be performed using a simple structure.

Figure 9:
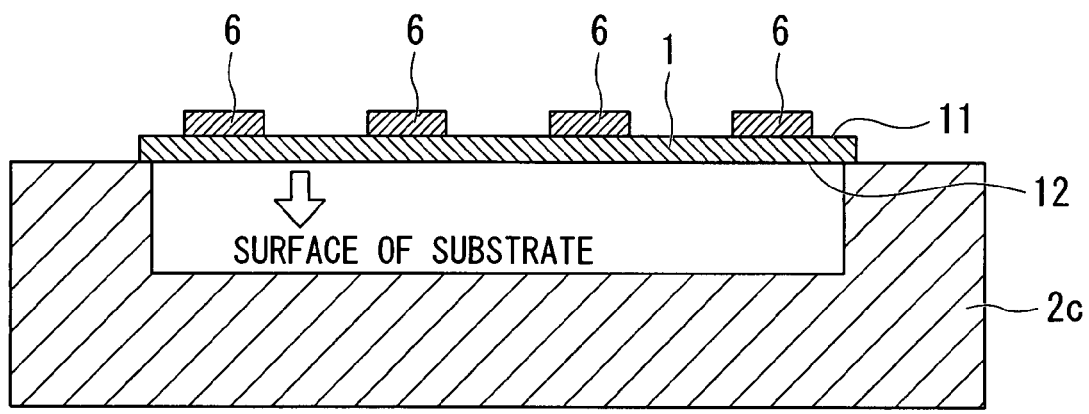
FIG. 9 is a schematic sectional view showing a tool and a semiconductor substrate in a third embodiment in accordance with the present invention.
Figure 10:
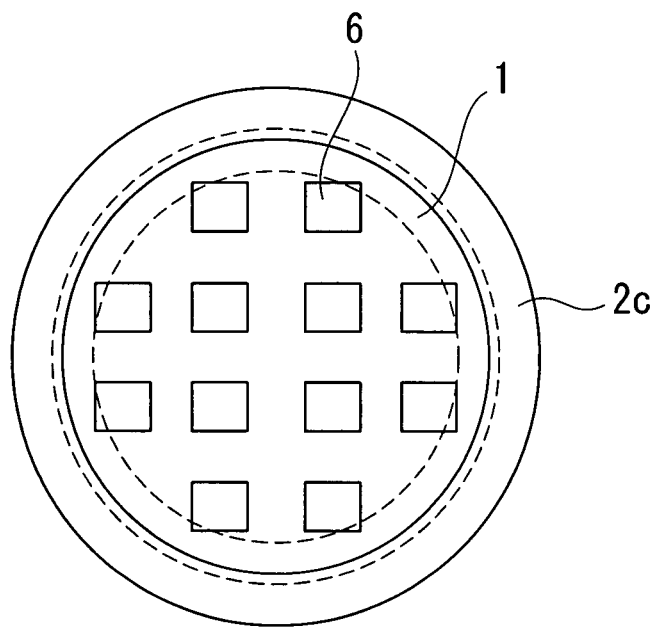
FIG. 10 is a schematic plan view showing the tool and the WBG substrate in the third embodiment.
Figure 11:
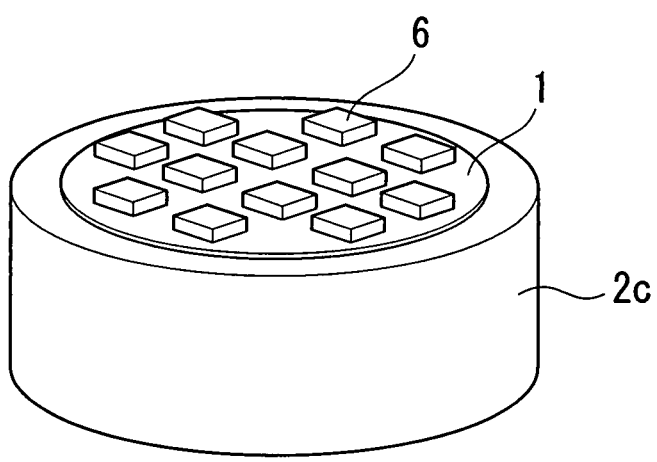
FIG. 11 is a schematic perspective view showing the tool and the WBG substrate in the third embodiment.

Next, a third embodiment of the present invention will be explained. In the present embodiment, heating of a semiconductor substrate is performed in a state shown by FIGS. 9 to 11. FIG. 9 is a sectional view showing a tool and a WBG substrate (as the semiconductor substrate) in the third embodiment. FIG. 10 is a plan view showing the tool and the WBG substrate in the third embodiment. FIG. 11 is a perspective view showing the tool and the WBG substrate in the third embodiment.

The WBG substrate 1 is disposed on a susceptor 2c in a manner such that a main surface 12 of the WBG substrate 1 faces the susceptor 2c. A plurality of small pieces 6 (as radiated-light absorbers) are disposed on the other main surface 11 of the WBG substrate 1, which have radiated-light absorption ability, and function as heating elements. The susceptor 2c and the small pieces 6 function as a tool for manufacturing a semiconductor device, in accordance with the present invention. The small pieces 6 absorb radiated light from the susceptor 2c, so that they heat and transmit generated heat to the WBG substrate 1. Accordingly, the WBG substrate 1 is efficiently heated.

As described above, a slight warp or unevenness is present in relevant faces of the susceptor 2c and the WBG substrate 1. Therefore, the contact area between the WBG substrate 1 and the susceptor 2c is actually small only when the WBG substrate 1 is simply disposed on the susceptor 2c. However, when the small pieces 6 are disposed on the WBG substrate 1, each small piece 6 contacts the WBG substrate 1. Therefore, the larger the number of the small pieces 6, the larger the contact area between the WBG substrate 1 and the small pieces 6, so that heat transmission from the small pieces 6 to the WBG substrate 1 is sufficiently performed. Here, the susceptor 2c and the small pieces 6 correspond to the transmitted-heat increasing mechanism of the present invention. A function of increasing the adherence between the WBG substrate 1 and the susceptor 2c can also be anticipated by appropriately controlling the number and the arrangement of the small pieces 6, so as to appropriately control the weight thereof.

The form and size of each small piece 6 are not limited. However, the larger the contact area between the WBG substrate 1 and the small pieces 6, the higher the heating efficiency. Therefore, in order to dispose a largest number of the small pieces 6 on the WBG substrate 1, each small piece 6 should be as small as possible while still being easy to handle. In FIG. 9, the main surface 12 of the WBG substrate 1 is a surface on which a desired device is formed. Preferably, the small pieces 6 are disposed on the back face, on which no device is formed, and thus are disposed on the main surface 11 of the WBG substrate 1. In addition, the susceptor 2c has a thicker peripheral edge in comparison with the remaining part which faces the device forming area in the main surface 12 of the WBG substrate 1.

Preferably, the material as the main constituent of the small pieces 6 has radiated-light absorption ability for absorbing light having a wavelength of 400 nm or higher. This is because the wavelength of radiated light, emitted from the susceptor 2c as the heating source, is approximately 400 nm or higher. Also preferably, (i) when the WBG substrate 1 is heated (e.g., at approximately 2000° C.), each small piece 6 does not become deformed or undergo a chemical change, and (ii) the small pieces 6 do not damage the WBG substrate 1. When the main constituent of the WBG substrate 1 is silicon carbide, it is preferable that the main constituent of the small pieces 6 be graphite. Graphite has a radiation rate close to 1, and thus easily receives radiated heat. In addition, carbon as the element for forming graphite occupies half of the elements for forming silicon carbide, so that no problem with respect to contamination occurs. Furthermore, graphite is reliably resistant to the high temperature of 2000° C., and in most cases, the main constituent of the susceptor 2c is also graphite. Therefore, it is unnecessary to be concerned about a reaction between the small pieces 6 and the susceptor 2c. Instead of graphite, the main constituent of each small piece 6 may be metal having a high melting point, such as graphite, tungsten, molybdenum, or tantalum, or a carbide of any one of them. The main constituent of each small piece 6 may also be (i) a mixture of separate elements, which are graphite and a metal having a high melting point, or a carbide thereof, or (ii) graphite, at least a part of which is covered with a metal having a high melting point, or a carbide thereof.

Figure 12:
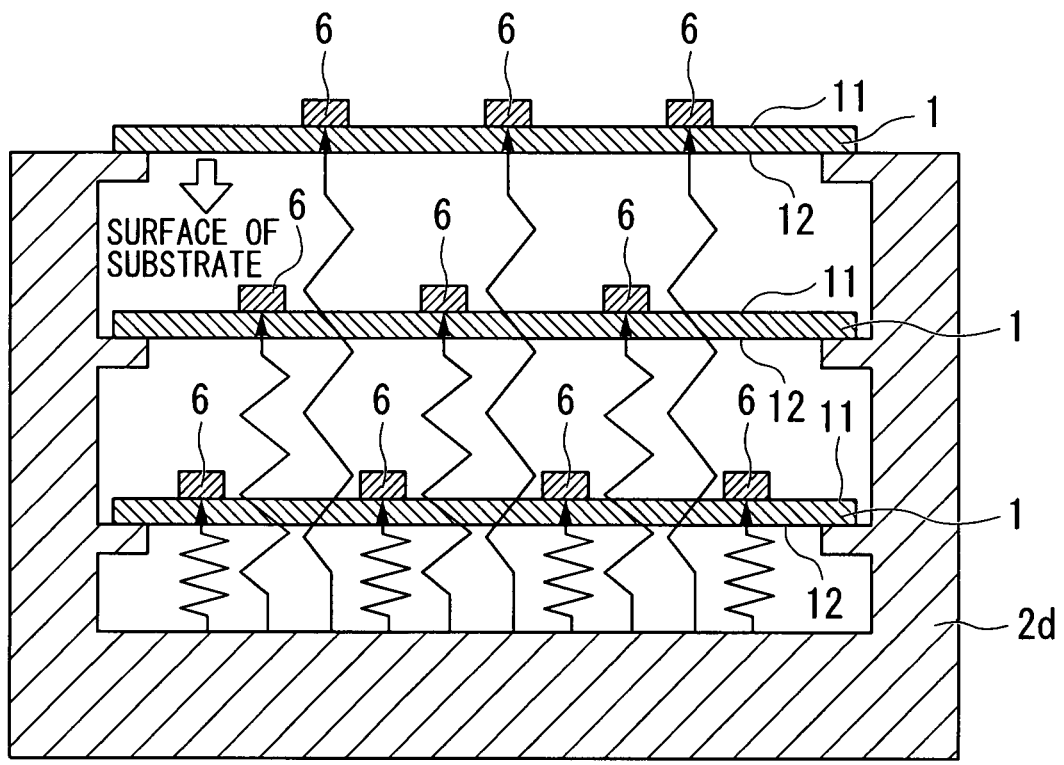
FIG. 12 is a schematic sectional view showing a variation of the third embodiment.
Figure 13:
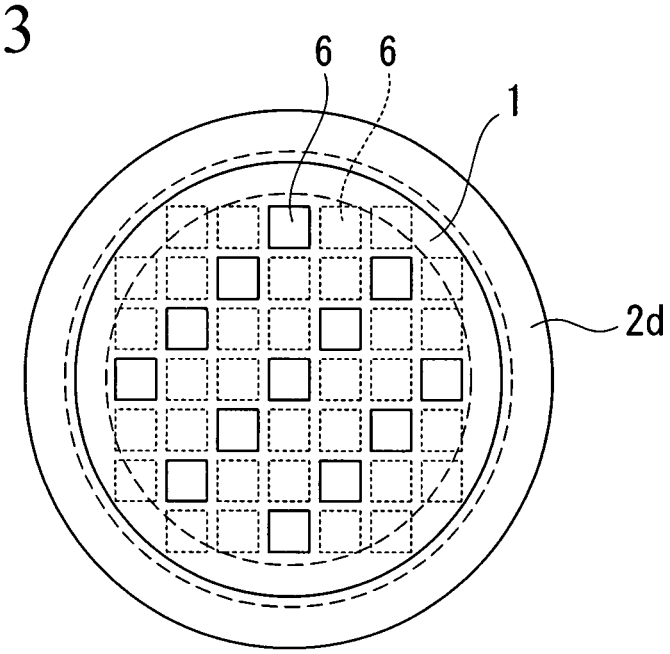
FIG. 13 is a schematic plan view showing the variation.
Figure 14:
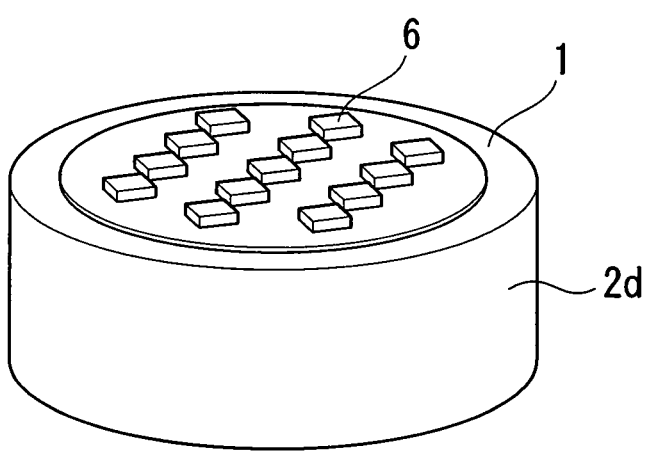
FIG. 14 is a schematic perspective view showing the variation.

FIGS. 12 to 14 show a variation of the third embodiment. FIG. 12 is a sectional view showing the variation. FIG. 13 is a plan view showing the variation. FIG. 14 is a perspective view showing the variation.

As shown in FIG. 12, the susceptor 2d can support a plurality of WBG substrates 1, and install the WBG substrates 1 in a stacked form. That is, the susceptor 2d has three support parts along the inner side face thereof, each being able to contact and support a WBG substrate 1. The three support parts are formed along the inner side face of the susceptor 2d, and separated from each other in the vertical direction. Each of the WBG substrates 1 is disposed on each support part, so that the three WBG substrates 1 are arranged in an overlapped manner via gaps therebetween, in plan view. On the main surface 11 of each WBG substrate 1, a plurality of small pieces 6 are disposed. As the plurality of the WBG substrates 1 can be installed at the susceptor 2d, they can be simultaneously heated.

It is preferable that the small pieces 6 be arranged in a manner such that they do not overlap with each other in plan view. FIGS. 12 to 14 show an ideal state in which each small piece 6 does not overlap with any small piece 6 positioned above or below. Accordingly, radiated light from the susceptor 2d reaches every small piece 6 while it is not obstructed by the other small pieces 6. Therefore, heating can be more efficiently performed in comparison with an arrangement in which the small pieces 6 overlap with each other in plan view.

In the heating process of the above-described third embodiment and the present variation, the heating apparatus as shown in FIG. 4 can be used, and the procedure of the heating process is similar to that shown in FIG. 5. When a plurality of the WBG substrates 1 are installed in the susceptor 2d in the variation, the steps S100 to S110 in FIG. 5 are repeatedly performed a number of times, which corresponds to the number of the substrates (here, the small pieces 6 are substituted for the heavy-weight stone 3). The susceptor 2d and the small pieces 6 correspond to the transmitted-heat increasing mechanism of the present invention. A function of increasing adherence between the WBG substrate 1 and the susceptor 2d can also be anticipated by appropriately controlling the number and the arrangement of the small pieces 6, so as to appropriately control the weight thereof.

In accordance with the above-described embodiment, the small pieces 6 as the heating elements are disposed on the WBG substrate(s) 1, so that the contact area between the WBG substrate 1 and the heating elements increases. Therefore, heat is easily transmitted from the heating elements to the WBG substrate 1, thereby easily heating the WBG substrate 1 in the vacuum. With respect to contamination of the WBG substrate 1 due to the small pieces 6, the small pieces 6 are simply disposed on the WBG substrate 1, so that they can be more easily separated from the substrate in comparison with the conventional carbon or metal deposition method, which is disclosed in Patent Document 1, or the like. Therefore, it is possible to prevent the semiconductor substrate or the relevant manufacturing line from being contaminated by metal. Furthermore, no complex mechanism is necessary for disposing and removing the small pieces 6 to and from the WBG substrate 1, and thus heating of the WBG substrate 1 can be performed using a simple structure. In addition, in order to fasten the small pieces 6 to the WBG substrate 1, an adhesive layer (as used in a fourth embodiment explained below) may be provided between the WBG substrate 1 and the small pieces 6.

Figure 15:
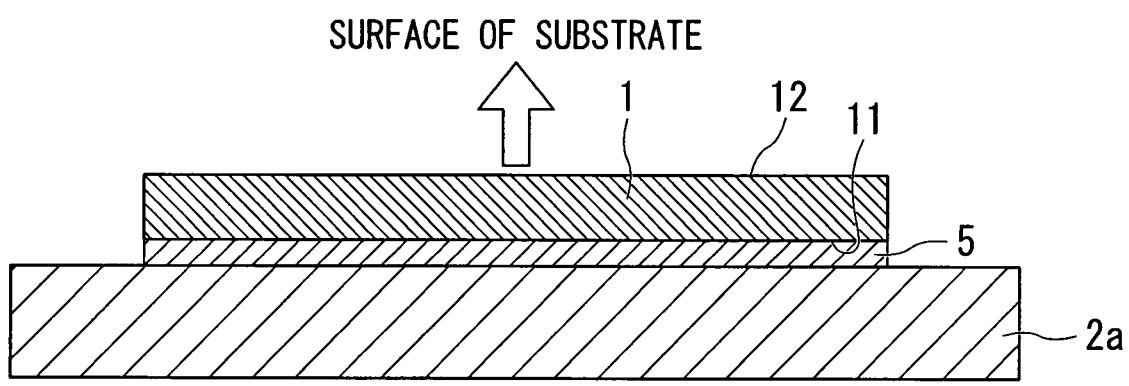
FIG. 15 is a schematic sectional view showing a tool and a semiconductor substrate in a fourth embodiment in accordance with the present invention.

The fourth embodiment of the present invention will be explained. FIG. 15 is a sectional view showing the fourth embodiment. As shown in FIG. 15, an adhesive layer 5 is formed between a WBG substrate 1 (having main surfaces 11 and 12) and a susceptor 2a (whose main constituent may be graphite (C)), so that the WBG substrate 1 and the susceptor 2a adhere to each other via the adhesive layer 5. Heat is transmitted from the susceptor 2a to the adhesive layer 5, and further transmitted from the adhesive layer 5 to the WBG substrate 1, thereby obtaining a similar effect to that obtained by an increase in the contact area between the WBG substrate 1 and the susceptor 2a. Therefore, heat is sufficiently transmitted from the susceptor 2a to the WBG substrate 1. In addition, it is unnecessary to form the adhesive layer 5 in a manner such that the entire main surface 11 of the WBG substrate 1 contacts the adhesive layer 5, because the object of providing the adhesive layer 5 is to transmit heat from the susceptor 2a via the adhesive layer 5 to the WBG substrate 1. That is, the adhesive layer 5 may be formed in a manner such that a part of the main surface 11 contacts the adhesive layer 5. However, the contact area between the main surface 11 and the susceptor 2a via the adhesive layer 5 should be larger than the contact area between the main surface 11 and the susceptor 2a when the WBG substrate 1 is simply disposed on the susceptor 2a. Here, the susceptor 2a and the adhesive layer 5 correspond to the adherence increasing mechanism of the present invention.

The main constituent of the adhesive layer 5 may be saccharide such as monosaccharide (e.g., glucose, fructose, galactose, or mannose), disaccharide (e.g., sucrose, maltose, lactose, or cellobiose), or polysaccharide (e.g., starch or cellulose). The adhesive layer 5 may be formed by the following procedure. A water solution of saccharide is deposited on the susceptor 2a, and the WBG substrate 1 is disposed thereon. The susceptor 2a is heated in this state, so that water evaporates and the saccharide is carbonized, thereby forming the adhesive layer 5. When a slight amount of mechanical external force is applied to the adhesive layer 5 after heating the WBG substrate 1, the WBG substrate 1 can be easily detached from the adhesive layer 5. Here, a resist can be used as the adhesive layer 5. However, resist includes heavy metal, and thus another material is preferable in consideration of metal contamination.

Figure 16:
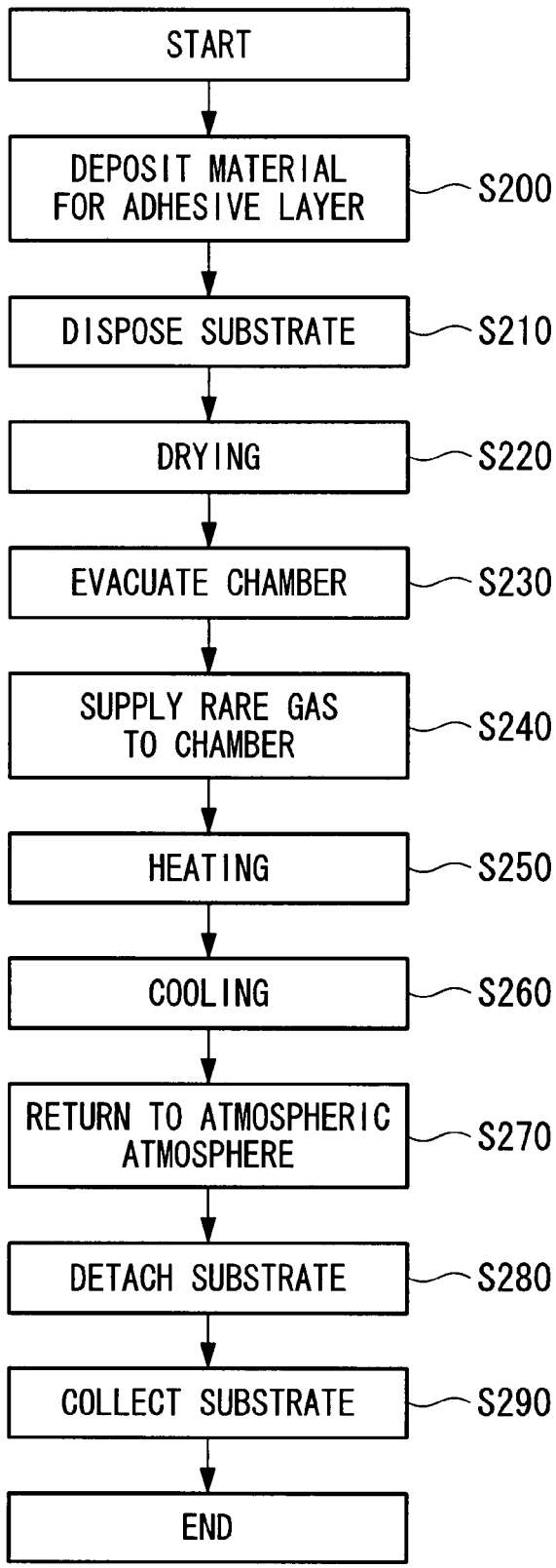
FIG. 16 is a flowchart showing the procedure of the heating process in the fourth embodiment.
Figure 17:
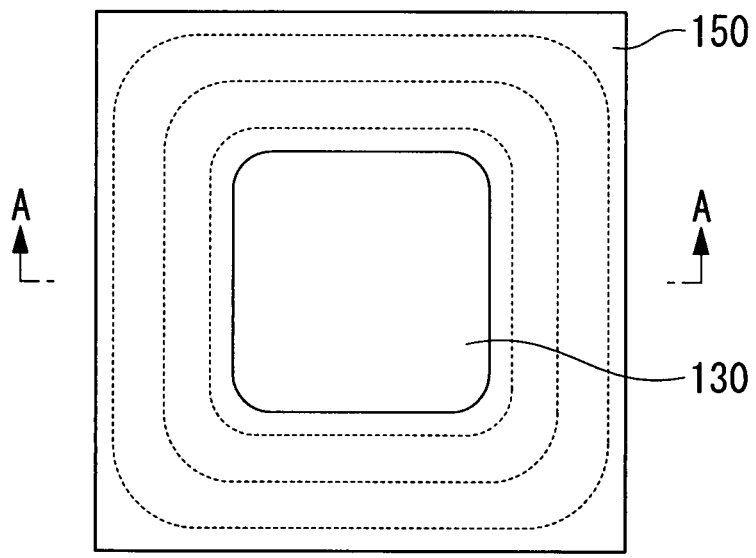
FIG. 17 is a schematic plan view showing a planar structure of a Schottky barrier diode.
Figure 18:
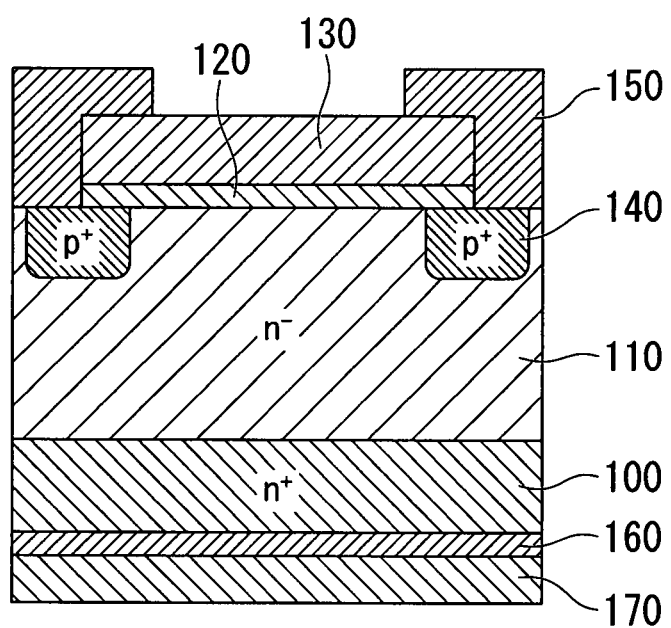
FIG. 18 is a schematic sectional view showing a sectional structure of the Schottky barrier diode along line A-A in FIG. 17.
Figure 19:
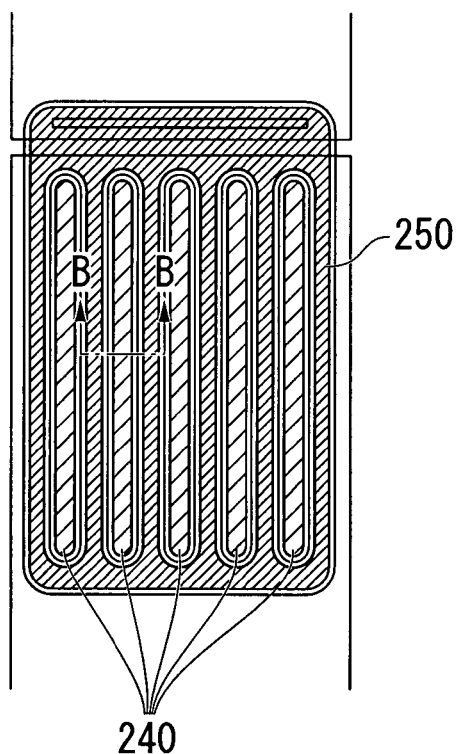
FIG. 19 is a schematic plan view showing a planar structure of a junction transistor.
Figure 20:
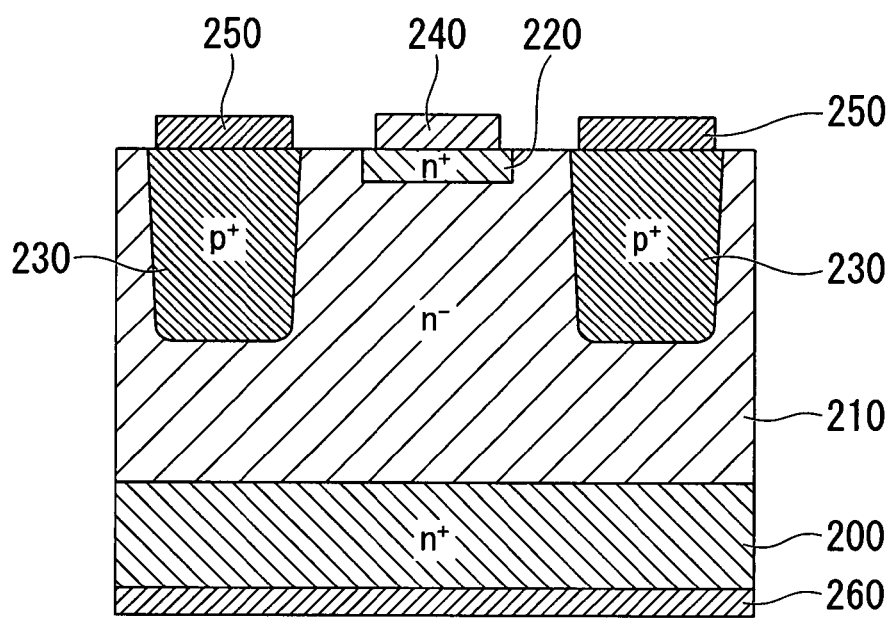
FIG. 20 is a schematic sectional view showing a sectional structure of the junction transistor along line B-B in FIG. 19.
Figure 21:
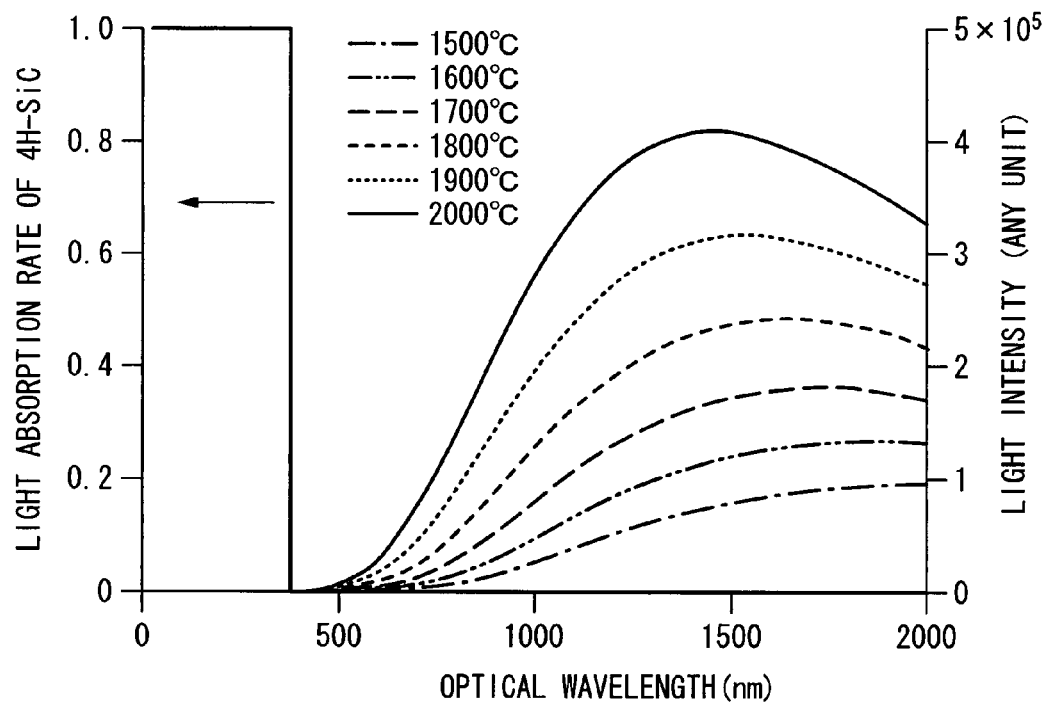
FIG. 21 is a graph showing wavelength dependency of the light absorption rate of 4H—SiC, and also wavelength dependency of light intensity radiated from a heating source.
Figure 22:
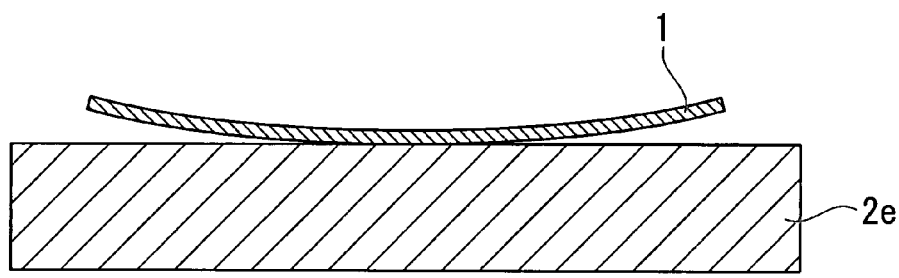
FIG. 22 is a schematic diagram showing a state in which a warp is present in the substrate.

Below, the procedure of the heating process of the present embodiment will be explained with reference to FIGS. 4 and 16. In this process, first, a water solution of saccharide, used for forming the adhesive layer 5, is deposited on the susceptor 2a (see step S200). Then the WBG substrate 1 is disposed on the susceptor 2a (see step S210), and they are left in an atmospheric or dry-gas atmosphere at 0° C. or higher for 1 second or longer, so that water is evaporated, and the adhesive layer 5 is formed (see step S220).

Next, the susceptor 2a, to which the WBG substrate 1 is adhered via the adhesive layer 5, is disposed in the quartz chamber 72 of the heating apparatus, which has retrieved the atmospheric pressure, and then the quartz chamber 72 is exhausted using the vacuum pump (see step S230). In the next step, a rare gas such as argon is supplied into the quartz chamber 72 (see step S240). When heating is performed in the vacuum, the process of step S240 is omitted. Next, the WBG substrate 1 is heated to have a desired temperature (e.g., approximately 2000° C.) by induction heating (see step S250), and then it is cooled by leaving the substrate in a cool atmosphere, or moving the substrate to a cooling stage (see step S260). The quartz chamber 72 is then returned to the atmospheric atmosphere (see step S270), and an external force is applied to the adhesive layer 5 so that the WBG substrate 1 is detached from the adhesive layer 5 (see step S280). The WBG substrate 1 is then collected (i.e., removed) (see step S290).

In accordance with the above-described embodiment, as the adhesive layer 5 is formed between the WBG substrate 1 and the susceptor 2a, the contact area between the WBG substrate 1 and the susceptor 2a effectively increases. Therefore, heat is easily transmitted from the susceptor 2a to the WBG substrate 1, thereby easily heating the WBG substrate 1 in the vacuum. With respect to contamination of the WBG substrate 1 due to the adhesive layer 5, the adhesive layer 5 is easily detached by applying a force thereto, so that it can be more easily separated from the substrate in comparison with the conventional carbon or metal deposition method, which is disclosed in Patent Document 1, or the like. Therefore, it is possible to prevent the semiconductor substrate or the relevant manufacturing line from being contaminated by metal. In particular, when the main constituent of the adhesive layer 5 is saccharide, the adhesive layer 5 does no include metal, and thus there is no metal contamination.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

For example, there are various methods for heating a semiconductor substrate, such as (i) heating a conductive susceptor by induction heating, (ii) heating a radiated-light absorber on a semiconductor substrate by using a light lamp, (iii) electrically energizing a susceptor so as to heat it, (iv) transferring and inserting a susceptor and a semiconductor substrate to a furnace having a high-temperature inner atmosphere, so as to heat them, and (v) emitting an electronic beam to a susceptor so as to heat it. However, the heating method is not limited to the above. In addition, the object of the heating process is not limited to only activation.

The semiconductor substrate used in the heating process may be made of silicon carbide, diamond, nitride (or nitride semiconductor), or the like. The nitride may be gallium nitride (GaN), aluminum nitride (AlN), boron nitride (BN), or mixed crystal of some of them (e.g., aluminum gallium nitride (AlGaN) or boron aluminum gallium nitride (BAlGAN)).

In addition, the semiconductor device, which can be manufactured by the manufacturing method including the heating process in a vacuum, may be a Schottky barrier diode, a PiN junction diode, an MPS (merged PiN Schottky barrier) diode, a JBS (junction barrier Schottky) diode, a MOS FET (metal oxide semiconductor field effect transistor), a static induction transistor (SIT), a junction field effect transistor (JFET), a MES FET (metal semiconductor field effect transistor), or a bipolar transistor.

What is claimed is:

1. A method of manufacturing a semiconductor device which consists essentially of:
   increasing adherence between a susceptor as a heating element, and a semiconductor substrate of a wide band gap semiconductor which is disposed on the susceptor, by using an adherence increasing mechanism; and
   heating the semiconductor substrate while in a vacuum to increase the temperature of the semiconductor substrate to a predetermined temperature by heating the susceptor as a heating source, said heating conducted by induction heating,
   wherein the adherence increasing mechanism includes the susceptor and another heating element which is disposed on the semiconductor substrate disposed on the susceptor and has induction heating or radiated-light absorption ability;
   said another heating element is a heavy-weight stone having a weight by which the susceptor and the semiconductor substrate are caused to closely adhere to each other; and
   the heavy-weight stone is disposed outside an area for forming a device in the semiconductor substrate.

2. The method in accordance with claim 1, wherein the main constituent of the semiconductor substrate is one of silicon carbide and diamond.

3. The method in accordance with claim 1, wherein the main constituent of the semiconductor substrate is nitride.

4. The method in accordance with claim 3, wherein the nitride is one of gallium nitride, aluminum nitride, boron nitride, aluminum gallium nitride, and boron aluminum gallium nitride.

5. The method in accordance with claim 1, wherein the semiconductor device is one of a Schottky barrier diode, a PiN junction diode, an MPS diode, a JBS diode, a MOS FET, a static induction transistor, a junction field effect transistor, a MES FET, and a bipolar transistor.

6. A method of manufacturing a semiconductor device which consists essentially of:
   increasing adherence between a susceptor as a heating element, and a semiconductor substrate of a wide band gap semiconductor which is disposed on the susceptor, by using an adherence increasing mechanism; and heating the semiconductor substrate while in a vacuum to increase the temperature of the semiconductor substrate to a predetermined temperature by heating the susceptor as a heating source, said heating conducted by induction heating, wherein the adherence increasing mechanism includes the susceptor and another heating element which is disposed on the semiconductor substrate disposed on the susceptor and has induction heating or radiated-light absorption ability;

said another heating element is a cap engaged with the susceptor; and the cap is disposed outside an area for forming a device in the semiconductor substrate.

7. The method in accordance with claim 6, wherein the main constituent of the semiconductor substrate is one of silicon carbide and diamond.

8. The method in accordance with claim 6, wherein the main constituent of the semiconductor substrate is nitride.

9. The method in accordance with claim 8, wherein the nitride is one of gallium nitride, aluminum nitride, boron nitride, aluminum gallium nitride, and boron aluminum gallium nitride.

10. The method in accordance with claim 6, wherein the semiconductor device is one of a Schottky barrier diode, a PiN junction diode, an MPS diode, a JBS diode, a MOS FET, a static induction transistor, a junction field effect transistor, a MES FET, and a bipolar transistor.

11. A method of manufacturing a semiconductor device, the method consisting essentially of:

increasing heat transmitted to a semiconductor substrate of a wide band gap semiconductor, which is disposed on a susceptor as a heating element, by using a transmitted-heat increasing mechanism which includes other heating elements dispersed on the entire plane of a main surface of the semiconductor substrate; and heating the semiconductor substrate while in a vacuum by induction heating to increase the temperature of the semiconductor substrate to a predetermined temperature by heating the susceptor, wherein the transmitted-heat increasing mechanism includes the susceptor and said other heating elements which are disposed on the semiconductor substrate disposed on the susceptor and have radiated-light absorption ability; and said other heating elements are a plurality of small pieces.

12. The method in accordance with claim 11, wherein the susceptor holds a plurality of the semiconductor substrates in a stacked form.

13. The method in accordance with claim 12, wherein the small pieces are arranged in a manner such that they do not overlap with each other in plan view.

14. The method in accordance with claim 11, wherein the small pieces are disposed outside an area for forming a device in the semiconductor substrate.

15. The method in accordance with claim 11, wherein the main constituent of the semiconductor substrate is one of silicon carbide and diamond.

16. The method in accordance with claim 11, wherein the main constituent of the semiconductor substrate is nitride.

17. The method in accordance with claim 16, wherein the nitride is one of gallium nitride, aluminum nitride, boron nitride, aluminum gallium nitride, and boron aluminum gallium nitride.

18. The method in accordance with claim 11, wherein the semiconductor device is one of a Schottky barrier diode, a PiN junction diode, an MPS diode, a JBS diode, a MOS FET, a static induction transistor, a junction field effect transistor, a MES FET, and a bipolar transistor.

19. An apparatus for manufacturing a semiconductor device which consists essentially of:

a chamber for housing a semiconductor substrate of a wide band gap (WBG) semiconductor, said semiconductor substrate being disposed on a susceptor as a heating element, a device configured to create a vacuum in the chamber, a heating device configured to heat the susceptor and in turn the semiconductor substrate while in the vacuum to increase the temperature of the semiconductor substrate to a predetermined temperature and to substantially eliminate contamination of the wide band gap (WBG) semiconductor caused by a non-vacuum atmosphere, said heating device disposed external to the chamber, and an adherence increasing mechanism which increases the adherence between the semiconductor substrate and the susceptor, wherein the adherence increasing mechanism includes the susceptor and another heating element which is disposed on the semiconductor substrate disposed on the susceptor and has induction heating or radiated-light absorption ability; and said other heating element is a weighted member which is peripherally applied to the semiconductor substrate.

20. An apparatus for manufacturing a semiconductor device which consists essentially of:

a chamber for housing a semiconductor substrate of a wide band gap (WBG) semiconductor, said semiconductor substrate being disposed on a susceptor as a heating element, a device configured to create a vacuum in the chamber, a heating device configured to heat the susceptor and in turn the semiconductor substrate while in the vacuum to increase the temperature of the semiconductor substrate to a predetermined temperature and to substantially eliminate contamination of the wide band gap (WBG) semiconductor caused by a non-vacuum atmosphere, said heating device disposed external to the chamber, and an adherence increasing mechanism which increases the adherence between the semiconductor substrate and the susceptor, wherein the adherence increasing mechanism includes the susceptor and another heating element which is disposed on the semiconductor substrate disposed on the susceptor and has induction heating or radiated-light absorption ability;

said other heating element is a cap member which is adjustably engaged with the susceptor; and the cap member is peripherally disposed on the semiconductor substrate and is in screw-engagement with the susceptor for adjustably increasing the adherence of the semiconductor substrate to the susceptor.

21. An apparatus for manufacturing a semiconductor device which consists essentially of:

a chamber for housing a semiconductor substrate of a wide band gap (WBG) semiconductor, said semiconductor substrate being disposed on a susceptor as a heating element, a device configured to create a vacuum in the chamber, a heating device configured to heat the susceptor and in turn the semiconductor substrate while in the vacuum to increase the temperature of the semiconductor substrate to a predetermined temperature and to substantially eliminate contamination of the wide band gap (WBG) semiconductor caused by a non-vacuum atmosphere, said heating device disposed external to the chamber, and a transmitted-heat increasing mechanism which includes other heating elements dispersed on the entire plane of a main surface of the semiconductor substrate, and increases heat transmitted to the semiconductor substrate, wherein the transmitted-heat increasing mechanism includes the susceptor and said other heating elements which are disposed on the semiconductor substrate disposed on the susceptor and have radiated-light absorption ability; and said other heating elements are a plurality of small pieces.

22. The apparatus of claim 21, wherein the susceptor holds a plurality of semiconductor substrates on which said small pieces are dispersed, said semiconductor substrates being disposed in a stacked spaced-apart relationship.

23. The apparatus of claim 21, wherein the small pieces are positioned so that they do not overlap with each other in plan view.

24. The apparatus of claim 21, wherein the small pieces are positioned outside of an area for forming a device in the semiconductor substrate.

* * * * *